(12) United States Patent
Chen

(10) Patent No.: US 6,414,524 B1
(45) Date of Patent: Jul. 2, 2002

(54) DIGITAL OUTPUT BUFFER FOR MOSFET DEVICE

(75) Inventor: Chung-Hui Chen, Hsin Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/812,517

(22) Filed: Mar. 20, 2001

(51) Int. Cl.[7] .................................................. H03K 3/00
(52) U.S. Cl. ........................................ 327/112; 327/170
(58) Field of Search ................................. 327/112, 111, 327/108, 170, 310, 379–384, 387, 388, 389, 391, 434, 437; 326/26, 27, 85, 87

(56) References Cited

U.S. PATENT DOCUMENTS

| | | | | |
|---|---|---|---|---|
| 4,992,676 A | * | 2/1991 | Gerosa et al. ................. | 326/27 |
| 5,109,166 A | * | 4/1992 | Coburn et al. ............... | 327/170 |
| 5,231,311 A | * | 7/1993 | Ferry et al. ................... | 326/27 |
| 5,838,186 A | * | 11/1998 | Inoue et al. ................. | 327/170 |

* cited by examiner

Primary Examiner—Toan Tran
(74) Attorney, Agent, or Firm—Tung & Associates

(57) ABSTRACT

A digital output buffer for an integrated circuit such as a MOSFET includes slew rate control and reduced crowbar current. The buffer includes pull-up and pull-down networks coupled between the input and output of the buffer. Each of the networks includes a plurality of conductive switch elements that are sequentially turned on or off by means of RC networks that control the switching delay between the conductive switch elements, and thus the slew rate of the buffer. The RC network includes a plurality of unbalanced passgates, each of which includes a high resistance and a low resistance that can be selectively coupled into circuit with the conductive switch elements so as to better control the timing of the turn on and turn off of the network, and thereby reduce crowbar currents.

10 Claims, 2 Drawing Sheets

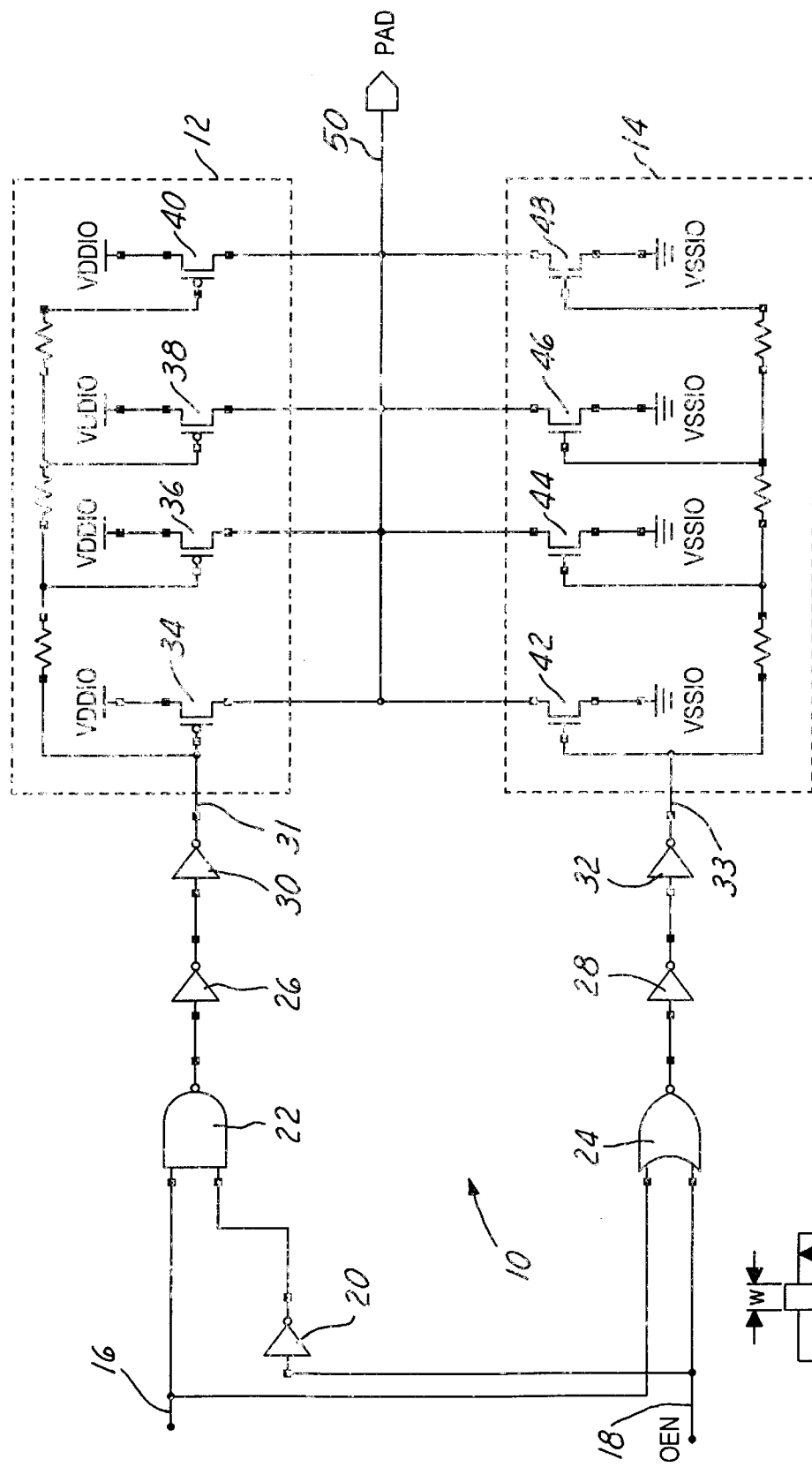
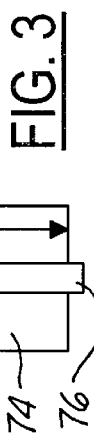
FIG. 1 (Prior Art)
FIG. 3

DIGITAL OUTPUT BUFFER FOR MOSFET DEVICE

FIELD OF THE INVENTION

The present invention broadly relates to output buffers used to reduce current and voltage spikes produced by Integrated circuits such as MOSFETS, and deals more particularly with a digital output buffer for controlling the slew rate on an output signal while reducing crowbar current.

BACKGROUND OF THE INVENTION

Output buffers are used in digital integrated circuits to drive an external load. Typically, the size of a load is not always known in advance, consequently most output buffers are designed to provide enough current to drive loads up to a maximum permissible level. This is normally accomplished by providing an output transistor that is sufficiently enlarge to drive a maximum permissible load, or by providing a number of smaller transistors coupled in parallel to drive the maximum permissible load.

Continuing advancements in the integrated circuit technologies has lead to improvements in the speed of integrated circuits, i.e. the time in which the output of a circuit reacts in response to a new input. Increasing integrated circuit speed has resulted in faster rise and fall times of the output voltage. Similarly, the fast rise and fall times of the output voltages have resulted in abrupt transitions in output current. In the case of output buffers used with power transistors, a problem is encountered when the output buffers are quickly turned on or off. Because the current flow is so large, fast switching of prior art buffers can produce transient such as noise spikes on the power, ground and data busses which result in data errors, latch-up and other problems in a digital electronic circuitry, One solution to this problem involves a technique referred to as slew-rate control. Slew-rate is defined as the rate of output transition of the buffer in volts per unit-time. Conventional digital buffers with slew-rate control use a number of parallel transistors which can be sequentially turned on to reduce the abruptness of the transition and thereby reduce the above mentioned transients. A plurality of transistors forming the buffer can be controlled by delay elements or by feed-back from the output of the buffer.

The transistor of a digital output buffer can be arranged as a pull-up network which can pull up the output of a buffer to a certain level, and a pull-down network which can pull down the output of the buffer to a different, lower voltage. Because of the time delay involved in sequential turn on the transistors of each network, a problem is sometime encountered with slew-rate control when one of the networks of the buffer is being slowly turned on while the other network of the buffer is being slowly turned off. The problem resides in the fact that for a brief period of time, both networks are on. In other words, the network being turned on becomes active before the network being turned off completes it's turn-off sequence. As a result, during the period that both networks are active, a very large current know as a "crowbar" is allowed to flow.

Although a number of solutions to this problem have been proposed, none has been effective in achieving slow turn-on of the transistors in each network with the ability to quickly achieve turn-off so as to reduce or eliminate crow bar current. The present invention is directed towards satisfying this need in the art.

SUMMARY OF THE INVENTION

According to the invention, a digital output buffer is provided with use in an integrated circuit for driving an external load. The buffer includes a pull-up network for pulling up the voltage at the buffer output and a pull-down network for pulling down the voltage at the output. Each of the networks includes a plurality of switchable conducting devices, such as transistors, for controlling the flow of current from the buffer input to the buffer output, as well as a plurality of controllable delay devices for producing delayed, sequential switching of the conducting devices so as to control the slew rate of a signal propagating from the buffer input to the buffer output. Each of the delay devices preferably includes an unbalanced pair of passgates formed of complementary NMOS and PMOS transistors. One of the passgate transistors possesses a relatively high resistance, while the other transistor possesses a low relatively low resistance. During turn on of a network, the passgate transistors having the high resistance control the conducting devices so as to achieve a desired slew-rate. However, the passgate transistors having a low resistance are responsive to a turn-off signal to quickly turn off all of the conducting devices, without delay.

Accordingly, it is a primary object of the present invention to provide an output buffer for an integrated circuit, such a MOSFET that provides improved slew-rate control while minimizing or eliminating crowbar current.

Another object of the invention is to provide an output buffer as described above which may be constructed using conventional, existing circuit components.

A further object of the invention is to provide an improved output buffer as described above that effectively achieves slew-rate control through the provision of a variable resistance that forms part of an RC circuit that determines the slew rate.

A still further object of the invention is to provide an output buffer as described above which achieves turn on and turn off of separate transistor networks forming the buffer, without the need for additional logic circuitry.

These and further objects and advantages invention will be made clear or become apparent during the course of the following description of a preferred embodiment of the invention.

BRIEF DESCRIPTION OF THE DRAWINGS

In the drawings, which form an integral part of specification, and are to be read in conjunction therewith, and wherein which like reference numerals are employed to designate identical components in the various views:

FIG. 1 is a detailed schematic diagram of a digital output buffer for a MOSFET, according to the prior art:

DETAILED DESCRIPTION OF THE PREFERRED EMBODIMENT

Figure 2:
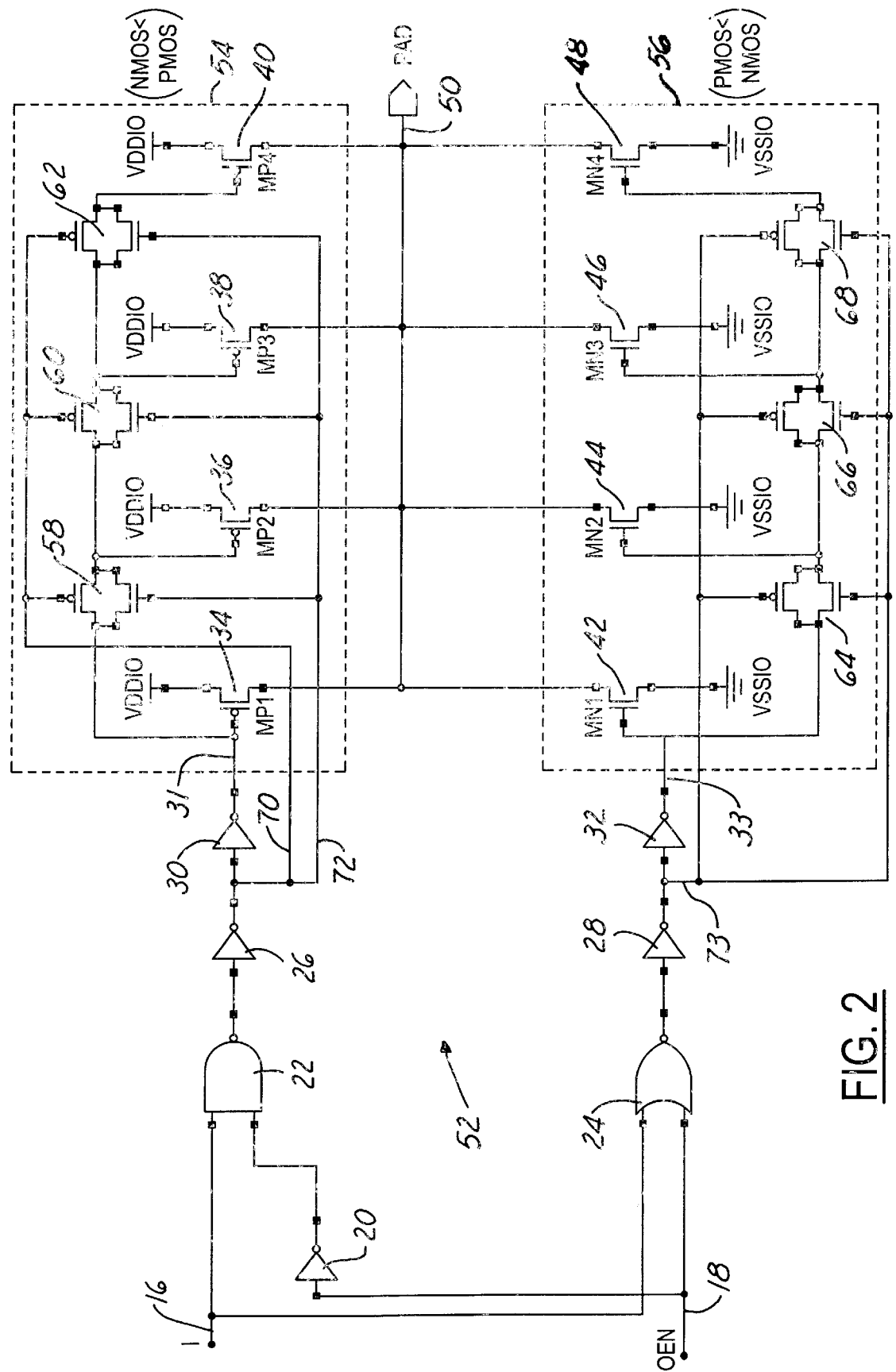
FIG. 2 is a detailed schematic diagram of the digital output buffer that forms the preferred embodiment of the present invention; and, FIG. 3 is a diagrammatic view illustrating the width to length ratio of a semiconductor channel forming part of one of the passgates used in the output buffer shown in FIG. 2.

Referring first to FIG. 1, a typical prior art digital output buffer, generally indicated with the numeral 10 has its input leads 16, 18 connected with the output of an integrated circuit, such as a MOSFET. The signals received on lines 16 and 18 are processed by a logic circuit and delivered respectively to a pair of transistor networks 12, 14. Network 12 includes multiple stages of transistors 34–40, each having their drains connecting to a voltage VDDIO and their sources connected to an output line 50 of the buffer 10. Similarly, network 14 comprises transistors 42-48 arranged in successive stages, each having its drain connected to the output line 50 and it source connected to a voltage VSSIO. The gates of transistors 34-40 are controlled by the input signals on lines 16, 18 but are turned on sequentially as the result of the use of resistors RP1, RP2 and RP3 being respectively connected between the input 31 and the gates of transistors 36-40. The resistance provided by resistors RP1, RP2 and RP3 combined with the internal capacitance of transistors 34-40 to form an RC time constant that creates a delay in the gate signal at the input 32.

In a similar manner, resistors RN1, RN2 and RN3 are respectively coupled between the gate of transistors 44-48 and the input 33 to network 14. Again, the differing RC time constants created by the combination of resistors RN1, RN2, and RN3 and the associated internal capacitance of resistors 42-48 produce an RC time delay in the delivery of the gating signals to transistors 44-48 so as to sequentially turn them on. In the case of the particular circuit shown in FIG. 1, transistors 34-40 are PMOS drivers, while transistors 42-48 are NMOS drivers. Network 12 is a pull-up network, while network 14 is a pull down network; these two networks 12, 14 effectively bifurcate the surge of current output on line 50, thus reducing what would otherwise be a very large voltage spike due to the large abrupt transition of the output current.

In operation, in order to turn on the PMOS driver network 12, the signals on lines 16 and 18 are high and low, respectively. The high signal on line 16 is gated through the NAND gate 22 and is passed through inverters 26, 30 so that the signal pg0 on input line 31 is low. The low voltage signal on line 31 is delivered directly to the gate of transistor 3, as well as to the gates of transistors 36-40, respectively through series connected resistors RP1, RP2 and RP3. Transistor 34 is turned on immediately, thereby conducting current to output line 50. However, there is a slight time delay in the turn on of transistor 36 as the result of the RC time delay created by the internal capacitance of transistor 36 combined with the resistance of resistor RP1. The time delay for turning on transistor 38 is even greater since the RC circuit value is greater as the result of the combined series resistance of resistors RP1, RP2. It can be readily appreciated then that transistors 34-40 are sequentially turned on in a time controlled manner to achieve a desired slew rate.

When PMOS driver network 12 reaches its maximum current output, it is turned off and the NMOS driver network 14 is turned on. In order to turn off network 12 and turn on network 14, the signals on input lines 16 and 18 are switched to low and high, respectively. The high signal on line 18 is gated through NOR gate 24 and is twice inverted by inverters 28 and 32 to form a high signal on input line 33. The high signal at input line 33 turns on transistor 42, which brings output line 50 to the voltage of VSSIO. NMOS driver transistors 44-48 are then sequentially turned on, with the delay between their turn on times being determined by the RC networks formed by the internal capacitance of these transistors in combination with the series connected resistors RN1, RN2 and RN3.

A problem exists, however, in that when signals on lines 31 and 33 go low and high, respectively, network 14 is turned on instantly, but there is a delay before network 12 is turned off. Specifically, transistor 42 begins conducting before transistor 40 is turned off. This overlap is due to the fact that the RC network comprising resistors RP1, RP2 and RP3 combined with the internal capacitance of transistor 40 delays the delivery of the low signal on line 31 to the gate of transistor 40. As a result, with transistors 40 and 42 both simultaneously conducting, a crowbar current is created since both the VDDIO and VSSIO are simultaneously connected to the output buffer line 50. This crow bar current is both power consuming and creates electrical noise in the output signal.

Attention is now directed to FIG. 2 which depicts a novel output buffer 52 which also has a pull up network 54 and pull down network 56, similar to the prior art buffer shown in FIG. 1. Network 54 includes four stages of PMOS driver transistors 34-40, while pull down network 56 comprises four stages of NMOS driver transistors 42-48. The logic circuitry used to process the signals on input line 16 and 18 is identical to that shown in FIG. 1. According to the present invention, however, a novel means of achieving a desired slew rate is provided which essentially eliminates crowbar current caused by networks 54, 56 being on at the same time. This novel means of slew rate control involves the use of unbalanced passgates 58-68 which are used in lieu of the simple resistors RP1, RN1 etc. to provide the RC time delay necessary to achieve sequential turn-on of the driver transistors. Each of the passgates 58-68 comprises an unbalanced, complimentary pair of PMOS and NMOS transistors having their source and drains coupled together. In the case of network 54, the PMOS passgates MP_RP1, MP_RP2, MP_RP3 have their gates connected via line 70 to the output of inverter 26. The NMOS pass gates, MN_RP1, MN_RP2 and MN_RP3 have their gates connected via line 72 to the output of inverter 26. Thus, both the PMOS and NMOS passgates in network 54 all simultaneously receive the inverted signal output by inverter 26. The passgates 64-68 likewise each comprise a pair of unbalanced, complimentary PMOS and NMOS passgates having their sources and drains coupled together. Specifically, passgates 54-68 respectively include PMOS passgates NP_RN1, NP_RN2 and NP_RN3, as well as corresponding NMOS passgates MN_RN1, MN_RN2 and MN_RN3. The gates of each of these latter mentioned PMOS and NMOS passgates are coupled by a line 73 to receive the inverted output signal from inverter 28.

In accordance with the present invention, the PMOS and NMOS passgate pairs for each of these devices have substantially different turn-on resistances. As will be discussed later herein, the individual passgates having relatively high resistance are switched into circuit with the driver transistors 34-46 when the corresponding network 54, 56 is turned on, but the other, complimentary passgates having relatively low resistance are gated on when it is desired to turn off one of the networks 54, 56. During network turn-off, it can be appreciated that quick turn off of all transistor stages is accomplished since the related passgates have very little resistance that would contribute to the RC circuit time delay. The difference in the amount of passgate resistance is achieved by controlling the width to length ratio of the MOSFET channel, as is illustrated in FIG. 3. The MOSFET channel 76 formed in a semiconductor substrate 74 possesses a width "w" and a length "l". A small width to length ratio results in a smaller current flow through the MOSFET, and thus presents a larger resistance. Conversely, a larger width to length ratio results in a larger current flow and a smaller resistance. In the case of the embodiment shown in FIG. 2, the individual passgates MN_RP1, MN_RP2 and MN_RP3 in network 54, as well as MP_RN1, MP_RN2 and MP_RN3 in network 56 all have active semiconductor channels possessing relatively small width to length ratios and thus have conductive paths that possess relatively high resistance, approaching those of the resistors RP1, etc. shown in FIG. 1. The remaining, complimentary individual passgates MP_RP1, MP_RP2, MP_RP3, MN_RN1, MN_RN2 and MN_RN3 all have relatively high width to length ratios and thus provide conductive paths having resistance values that are much less than those pass gates having small width to length ratios.

Turning now to the operation of the output buffers shown in FIG. 2, in order to turn on power 54, signals on input line 16 and 18 are switched to high and low, respectively. The low signal on line 31 turns on transistor 34 and is delivered to passgate device 58. The individual PMOS passgates are devices 58–62 receive a high signal on line 70 from the output of inverter 26, while this same high signal is delivered via line 72 to the gate electrodes of the individual NMOS passgates forming part of devices 58–62. Since the signal output by inverter 26 is high, MN_MP1, MN_RP2 and MN_RP3, which all include relatively large resistances, are turned on, while MP_RP1, MP_RP2 and MP_RP3 remain off. As a result, the signal on line 31 is sequentially gated through passgates 58,60 and 62 in a time delayed fashion to sequentially turn on transistors 36, 38 and 40. Thus, the turning on of network 54 shown in FIG. 3 is essentially identical to that of network 12 shown in FIG. 1, with a similar slew rate control being achieved.

When it is desired to turn off network 54 and simultaneously turn on network 56, the signals on lines 16 and 18 are both switched to low, thereby resulting in a high signal on line 31 and a low signal on line 33. Further, the signal on lines 70 and 72 goes low. Since line 72 forms the common gate for passgates MN_RP1, MN_RP2 and MN_RP3, these three latter mentioned passgate are immediately turned off, without delay. In contrast, the low signal on line 70 is delivered to the gates of passgates NP_RP1, NP_RP2 and NP_RP3, thereby turning on these passgates. With these latter mentioned pass gates turned on, the high signal on line 31 is passed through to the gates of transistors 36, 38 and 40 thereby immediately turning off the latter without delay. Therefore, when network 56 begins turning on, network 54 including the last driver stage 40 has been turned off. Consequently, the possibility for the flow of a crowbar current is essentially eliminated. Continuing the sequence of operation, the low signal on line 33 is delivered to the gate of NMOS transistor 42, thereby turning the latter on so that the first stage of the pull down network 56 is connected with the buffer output 50. Simultaneously, the high signal on line 73 is delivered to all gate inputs of passgate devices 64–68. Since the turn on resistance is high for passgates NP_RN1, NP_RN2 and NP_RN3 owing to their small width to length active channel ratio, they control the sequential turn on of transistors 44–48 at a controlled slew rate determined by the resistance values of these latter mentioned passgates. In a manner of operation similar to that previously described with reference to network 54, during turn off of network 56, the low signal on line 33 is quickly gated virtually simultaneously to the gate electrodes of PMOS drivers 42–48, as a result of the signal on line 73 switching from high to low. The low signal on line 73 is gated to pass gates MN_RN1, MN_RN2 and NM_RN3 which quickly pass through, without delay, the signal on line 33 to the gates of transistors 44–48.

From the foregoing it is apparent that the novel output buffer described above not only provides for the reliable accomplishment of the objects of the objects of the invention, but does so in a particularly effective, and economical manner. It is recognized, of course, that those skilled in the art may make various modifications or additions chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. For use with an integrated circuit, a digital output buffer having an input and having an output for driving an external load, comprising:

a pull up network for pulling up the voltage at said output; and, a pull down network for pulling down the voltage at said output, wherein each of said networks includes (a) a plurality of switchable conducting devices for controlling the flow of current from said input to said output, and (b) a plurality of controllable delay devices for producing delayed, sequential switching of said conducting devices so as to control the slew rate of a signal propagating from said input to said output, each of said delay devices includes an unbalanced pair of passgates, each of said pairs of passgates includes a complementary pair of NMOS and PMOS transistors.

2. The digital output buffer of claim 1, wherein:

one of said transistors includes a body of semiconductor material having a first active semiconductor channel disposed therein, said first channel having a first width-to-length ratio, the other of said transistors includes a body of semiconductor material having a second active semiconductor channel disposed therein, said second channel having a second width-to-length ratio, and said first ratio is substantially greater than said second ratio.

3. The digital output buffer of claim 1, wherein each of said conducting devices includes a transistor having a gate controlled by one of said pairs of passgates.

4. The digital output buffer of claim 1, wherein each of said transistors includes a gate coupled with said buffer input.

5. The digital output buffer of claim 1, wherein the passgates in each of said pairs thereof have substantially different internal resistances which respectively delay the switching of a corresponding conducting device differing amounts of time.

6. The digital output buffer of claim 1, wherein each of said passgates in each of said pairs thereof has a gate electrode coupled with said buffer input.

7. For use with an integrated circuit, a digital output buffer having an input and having an output for driving an external load, comprising:

first and second transistor networks for reducing current spikes at said buffer output, each of said networks including (a) a plurality of switchable transistor stages coupled between and controlling the flow of current from said input to said output, (b) a plurality of controllable delay devices coupled with and producing sequential switching of said transistor stages, each of said delay devices having first and second differing resistances, a first state in which said first resistance is coupled into circuit with one of said transistor stages and a second state in which said second resistance is coupled into circuit with said one transistor stage, each of said controllable delay devices includes a pair of unbalanced passgates, each of said pairs of passgates includes a complementary pair of NMOS and PMOS transistors.

8. The digital output buffer of claim 7, wherein:

one of said transistors includes a body of semiconductor material having a first active semiconductor channel disposed therein, said first channel having a first width-to-length ratio, the other of said transistors includes a body of semiconductor material having a second active semiconductor channel disposed therein, said second channel having a second width-to-length ratio, and said first ratio is substantially greater than said second ratio.

9. The digital output buffer of claim 7, wherein each of said transistor stages includes a transistor having a gate controlled by one of said pairs of passgates.

10. The digital output buffer of claim 7, wherein each of said delay devices is coupled between two of said transistor stages and includes a pair of control inputs for controlling the coupling said first and second resistances into circuit with said one transistor stage.

\* \* \* \* \*